United States Patent [19]

Launay

[11] 4,298,087

[45] Nov. 3, 1981

[54] UNIDIRECTIONAL SPEAKER ENCLOSURE

[76] Inventor: Dominique Launay, 4 Ave. des Chardons, 94800 Villejuif, France

[21] Appl. No.: 66,539

[22] Filed: Aug. 15, 1979

[30] Foreign Application Priority Data

Aug. 16, 1978 [FR] France ................................ 78 23848

[51] Int. Cl.³ ................................................ H05K 5/00

[52] U.S. Cl. ...................................... 181/153; 181/156

[58] Field of Search ................................ 181/148, 156

[56] References Cited

U.S. PATENT DOCUMENTS 3,638,753 2/1972 Cunningham ....................... 181/153

FOREIGN PATENT DOCUMENTS 109966 3/1940 Australia ............................ 181/156

*Primary Examiner*—L. T. Hix

*Assistant Examiner*—Thomas H. Tarcza

*Attorney, Agent, or Firm*—Robert E. Burns; Emmanuel J. Lobato; Bruce L. Adams

[57] ABSTRACT

A unidirectional speaker enclosure has a cylindrical cabinet supporting a speaker at its front end and having a closed bottom at its rear end. The front end constitutes a main aperture surrounded concentrically by a secondary aperture communicating with the rear face of the speaker membrane through two relatively large resonance chambers formed by two cylinders disposed concentrically within the cylindrical cabinet. The arrangement is such that a lag corresponding to a wavelength of the desired critical frequency is obtained between the backward wave and the forward wave produced by the speaker membrane.

8 Claims, 2 Drawing Figures

UNIDIRECTIONAL SPEAKER ENCLOSURE

BACKGROUND OF THE INVENTION

1. Field of the Invention

This invention relates in general to speaker enclosures or systems and has specific reference to a unidirectional speaker enclosure or system.

2. Description of the Prior Art

It is known that a speaker system comprises as a rule a support and at least one transducer, notably a loudspeaker, secured to the support and having the front face of its membrane directed towards an aperture of the support.

It is also known that, due to its very conception, a speaker system generates interferences resulting from the fact that the loudspeaker membrane, when a signal is fed to the speaker input, produces concomitant and phase-opposed movements of the air on the one hand forwards and on the other hand backwards of the membrane. The backward wave is equal and in phase opposite with respect to the forward wave, and the addition of these two waves leads to a tone cancellation which of course is not satisfactory.

To solve this problem, two main methods have been used up to now. The first method is directed to deaden the backward wave in order to reduce the negative and detrimental effect produced thereby on the front or forward wave. The other method aims at transforming or "handling" the backward wave in such a manner that it will reinforce, or at least not interfere with, the forward wave.

One way of implementing the first method consists in constructing a so-called "infinite" speaker enclosure in which the support structure consists essentially of a rigid cabinet or box provided with a single front aperture registering with the front face of the speaker membrane, the box being otherwise tightly closed. However, in actual practice this solution is not fully satisfactory. In fact, any membrane movement is attended by a variation in the pressure of the air contained in the box, thus urging the membrane in the direction opposite its normal movement, so that the membrane undergoes a certain damping effect. Now the greater the amplitude of the membrane movement, the higher this damping effect, this greater amplitude corresponding of course to the low-frequency range of operation of the speaker.

This first method is illustrated notably in the French Pat. Nos. 1,587,761 and 2,260,916. In the first French Pat. No. 1,587,761 the speaker system is not unidirectional. In the other French Pat. No. 2,260,916 the speaker system is unidirectional and the cabinet is divided into two compartments interconnected by a valve in order to attenuate the above-mentioned damping effect, however without producing fully satisfactory results.

The second method may be implemented in various ways. A first form of embodiment comprises an enclosure of which the support consists of a flat member having its free edge spaced from the loudspeaker by a distance corresponding substantially to one-half of the wavelength of the sensitive frequency, so that the back wave attaining the front portion of the enclosure is delayed in relation to the front wave to an extent corresponding to one wavelength. In this specific arrangement, it is clear that the enclosure radiates the sound in all directions.

Another form of embodiment of this second method is illustrated by the so-called bass-reflex enclosure in which the backward wave is channelled for on the one hand imparting a certain delay thereto in relation to the forward wave and on the other hand directing the backward wave in a specific direction with respect to the forward wave. This principle is applied in many known constructions which differ notably according to the design of the wave channelling means. Thus, for example, reference may be made in this respect to the U.S. Pat. Nos. 4,033,431, 3,978,941, 3,993,162 and 4,064,966. However, these systems are attended by many inconveniences; thus, notably, the wave channelling means are far from having a complete efficiency. They are generally very elaborate and therefore expensive, cumbersome and heavy. The speaker enclosure proper is also expensive, cumbersome, heavy, and in many cases has a complex configuration ill suited for the use normally contemplated for a loudspeaker enclosure or system. Moreover, the direction or directions and sense of the backward wave radiation do not correspond necessarily to the direction and sense of the forward wave, so that the speaker system is in most instances non-directive or still multi-directional.

For certain specific applications, notably the sound installation in restrictive volumes and the use of microphones in rooms of reduced volumes, the use of unidirectional speaker enclosures, i.e. having a single direction and a single sense of sound radiation, in lieu of multi-directional or non-directional speaker enclosures, is required.

Now, as already explained in the foregoing, speaker systems of the so-called infinite type and also of the flat type are not capable of producing this unidirectional sound radiation. Speaker enclosures of the bass reflex type are also either ill-suited, since the backward wave is transmitted in a direction or a sense other than those of the forward wave, or unsatisfactory since the backward wave channelling means have the above-mentioned inconveniences.

SUMMARY OF THE INVENTION

The present invention is therefore directed to avoiding these inconveniences by providing a unidirectional speaker enclosure of reduced overall dimensions, which is simple in design, has a minimum weight and a shape permitting its normal use under any desired conditions.

To this end, the unidirectional speaker enclosure according to this invention, which comprises a cabinet or casing and at least one loudspeaker secured to the cabinet and having the front face of its membrane directed towards a main aperture of the cabinet, is characterized in that the cabinet is rigid and has a cylindrical configuration, and further comprises a single secondary aperture located in close proximity of the main aperture; and rigid partition means disposed within the cabinet for forming therein a chamber for channelling the air between the rear face of the speaker membrane and the secondary aperture. The other features characterized this invention will appear as the following description proceeds with reference to the attached drawing.

DESCRIPTION OF THE PREFERRED EMBODIMENT

Figure 1:
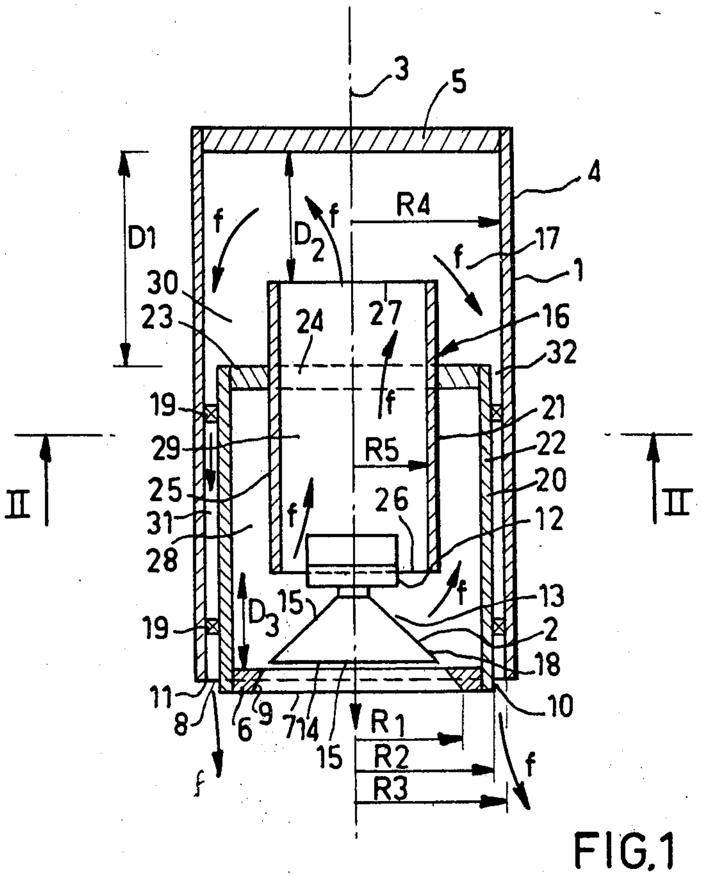
FIG. 1 is a diagrammatic axial section showing an exemplary form of embodiment of a speaker enclosure according to this invention.
Figure 2:
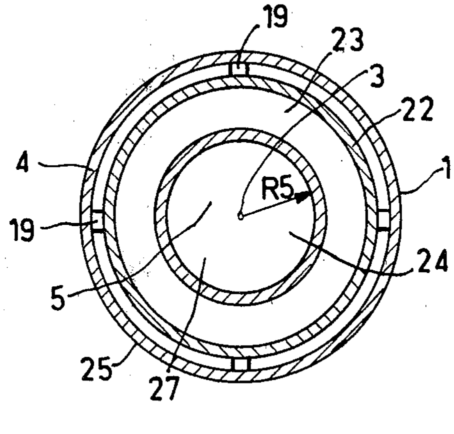
FIG. 2 is a diagrammatic cross section taken along the plane II—II of FIG. 1.

The unidirectional speaker enclosure according to this invention comprises a cabinet or box 1 and at least one transducer, notably a loudspeaker 2, secured to the cabinet 1.

This cabinet 1 has a general straight cylindrical configuration of revolution about an axis 3, with a circular base. This axis 3 is in fact an axis of revolution and also of symmetry for the complete speaker enclosure.

The cabinet 1 has a cylindrical lateral surface 4, a circular bottom 5 at its rear end and a front wall 6 at the front end of cabinet 1.

The cabinet structure, namely its lateral cylindrical wall 4, its bottom 5 and its front wall 6 are made of an extremely rigid and therefore distortion-free material, notably plastics, in order to prevent any cabinet vibration by acoustic resonance.

The front wall 6 has formed therein a first or main concentric aperture 7 and a second annular peripheral secondary aperture 8 concentric to the main aperture 7.

The first aperture 7 is generally circular and has a radius $R_1$ limited by an external edge 9.

The second aperture 8 is generally annular and defined by an inner circular edge 10 having a radius $R_2$, and by an outer circular edge 11 having a radius $R_3$.

According to a specific feature characterizing this invention, the outer circular edge 11 is coincident with, or located in close vicinity of, the lateral face 4, so that the radius $R_3$ is equal or close to the radius $R_4$ of the lateral face 4.

Therefore, the front wall has the general shape of an annular ring having an axis 3 and is bound internally by the edge 9 and externally by the edge 10.

According to this invention, the second aperture 8 lies in close vicinity of the first aperture 7, so that the radius $R_2$ is close to, or differs slightly from, the radius $R_1$, and the annular portion constituting the front wall 6 has a reduced radial width in comparison with the radial dimension of the complete cabinet 1.

It will be seen that the construction of the cabinet 1 in the form of a cylinder imparts a maximum rigidity to this structure.

The loudspeaker 2, of a type known per se, comprises a moving element 12 shown only diagrammatically, which is housed in the cabinet 1 and provided with lead-in wires (not shown) emerging from any suitable portion of the cabinet 1, notably through its bottom 5, and also a deformable membrane 13 of exponential configuration, having the same axis 3 as the cabinet proper, the major aperture 14 of this loudspeaker being located very close to the first aperture 7 which consequently lies adjacent the front face 15 of membrane 13. The first aperture 7 corresponds to the aperture 14 of membrane 13, and to this end the edge 9 of the first aperture 7 is preferably inclined, as illustrated in FIG. 1, so as to constitute substantially an extension of the membrane 13.

The loudspeaker 2 is secured directly or indirectly to the cabinet 1 through any suitable support means, possibly resiliently deformable means, known per se and not shown in order to simplify the drawing.

The speaker system according to this invention further comprises extremely rigid and therefore distortion-free partition means 16 disposed inside the cabinet 1 and forming therein a chamber 17 for channelling the air between the rear face 18 of membrane 13 and the second aperture 8.

The partition means 16 are also of revolution about the axis 3 and consist of any suitable rigid material, notably plastics, capable of imparting the desired rigidity thereto. Thus, these partition means 16 are not liable to be vibrated by acoustic resonance during the operation of the speaker enclosure. The partition means 16 are rigidly supported by the cabinet 1 through the medium of any suitable support means 19 such as distance-pieces shown only diagrammatically in the drawing. The partition means 16 are air-tight, which means that the air is positively caused to flow along the chamber 17, without any possibility of producing acoustic or sound short-circuits, as shown by the arrows f.

According to another feature characterizing this invention, the chamber 17 may fill completely the volume of the cabinet 1, i.e. the complete cavity defined by this cabinet 1 is shaped by the partition means 16 to constitute said chamber 17.

According to a preferred but not limiting form of embodiment of this invention, the chamber 17 comprises a plurality of successive compartments and to this end the partition means 16 are made of several sections.

In this specific form of embodiment, the partition means 16 comprise a pair of cylinders, i.e. an outer cylinder 20 and an inner cylinder 21 disposed coaxially to the common axis 3.

The outer cylinder 20 comprises a cylindrical lateral surface 22 and a bottom 23 at the rear end of its lateral surface 22. The latter, at its front end, is adjacent to the front a 6, at the location or in close proximity of the edge 10. In other words, the lateral surface 22 has a radius equal or close to $R_2$ and is adjacent to the lateral surface 4 of the cabinet 1. The bottom 23 is spaced transversely from the bottom 5 of cabinet 1 by a distance $D_1$ and lies in general in the central portion of this cabinet 1 at a location calculated for providing the predetermined acoustic impedances of the various compartments constituting the chamber 17.

A central circular aperture 24 of radius $R_5$ is formed through the bottom 23 and this aperture 24 has tightly fitted therein the lateral surface 25 of the inner cylinder 21 open partially or completely at its front and rear ends by corresponding apertures 26 and 27.

As clearly shown in the drawing, the radius $R_5$ is considerably smaller than radius $R_2$ and possibly smaller than radius $R_1$. Consequently, the lateral surface 25 is considerably spaced from lateral surface 22 and encloses the bottom 23, as already explained, so that the apertures 26 and 27 lie on either side of this bottom 23. However, the lateral surface 25 projects essentially forwardly of the bottom 23, that is, within the outer cylinder 20, and a shorter portion of cylinder 21 projects from the rear face of bottom 23, between this bottom 23 and the bottom 5 of cabinet 1. In any case, the rear aperture 27 is spaced from the bottom 5 by a distance $D_2$ such as to impart a specific acoustic impedance to the various compartments formed in the channelling chamber 17. The front aperture 26 of inner cylinder 21 is also spaced transversely from aperture 7 by a distance $D_3$ capable of imparting a specific acoustic impedance to said compartments. Thus, for example, the front aperture 26 is substantially coincident with, or in close vicinity of, the moving element 12 of speaker 2.

As already mentioned in the foregoing, the partition means 16 consisting of cylinders 20 and 21 form a chamber 17 divided into several successive sections, namely in the downstream direction between the membrane 13 (more particularly the rear face 18 thereof) and the second aperture 8: a first large resonance chamber 28, a tuning tunnel 29, a second large resonance chamber 30, and a decompression vent passage 31.

The first large resonance chamber 28 has a generally cylindrical configuration with an annular base, and is bound at the front by the front wall 6, at the rear by the bottom 23 and laterally by the surfaces 22 and 25. This chamber 28 is closely adjacent to the membrane 13 and lies on the side of the rear face 18 thereof. The first chamber 28 communicates through the aperture 26 with the tuning tunnel 29.

This tuning tunnel 29 has a substantially cylindrical general configuration bound laterally by the surface 25. This tuning tunnel 29 communicates through the aperture 27 with the second large chamber 30.

The second large chamber 30 has the complex configuration shown in FIG. 1 and is bound at the rear by the bottom 5 and at the front by the bottom 23 and the endmost rear portion of the lateral surface 25, and laterally by the endmost rear portion of the lateral wall 4. This second large chamber 30 communicates with the vent annular passage 31 through the annular space 32 existing between the bottom 23 and the lateral surface 22 of lateral wall 4.

Furthermore, the vent passage 31 has the shape of a relatively thin cylindrical passage having an annular base and is bound by the lateral face 22 and the foremost end portion of lateral wall 4. As already mentioned hereinabove, the vent passage 31 opens at the level of the second aperture 8.

The values give to radii $R_1$, $R_2$, $R_3$, $R_4$ and $R_5$, on the one hand, and to distances $D_1$, $D_2$ and $D_3$, on the other hand, are calculated to provide a lag of the order of one wavelength of a predetermined critical frequency between the backward wave and the forward wave produced by the speaker membrane.

Thus, the above-described speaker enclosure is of the open type, not of the closed type, since it comprises not only the conventional aperture 7 but also a second aperture 8. The speaker enclosure according to this invention is also of the unidirectional type since the sound is emitted coaxially through the second aperture 8, in the same sense as, and in close vicinity of, the main sound emission produced through the first aperture 7. The provision of simple, light-weight partition means 16 constitutes a positive advantage when considering the weight, cumbersomeness and cost factors of the speaker enclosure. The channelling chamber 17 comprising a plurality of successive compartments having specific sound impedances is capable of delaying the emission of the backward wave with respect to the forward wave, notably with a lag of the order of one wavelength of the critical emission frequency, and this constitutes a factor capable of improving considerably the acoustic quality of the speaker enclosure, especially in the low-frequency range. The construction of the speaker enclosure in the form of revolution illustrated makes it possible to use this enclosure for multifarious purposes while preserving its moderate overall dimensions and weight in conjunction with a sound styling. With a speaker enclosure of the type described hereinabove it is unnecessary to line the inner walls with sound-damping or padding material, in contrast to many prior art enclosure constructions. On the contrary, in the case of the present invention, such padding should preferably be avoided. Finally, the fact that the chamber 17 is open and that the first chamber 28 has a sufficiently large volume affords an adequate damping of the speaker membrane 13, that is, a damping which is neither too strong not too weak.

Of course, it will readily occur to those conversant with the art that many modifications may be brought to the specific forms of embodiment described, illustrated or suggested herein, notably in connection with the relative proportions of the component elements, without departing however from the basic principles of the invention as set forth in the appended claims.

What is claimed as new is:

1. A unidirectional speaker enclosure comprising a casing having a rigid cylindrical peripheral wall and a closed rear end, and having at its front end a central primary aperture and a single annular secondary aperture surrounding said primary aperture and adjacent a front end portion of said peripheral wall of the casing, an annular divider separating said secondary aperture from said primary aperture, a speaker mounted centrally in a forward portion of said casing and having a membrane facing said primary aperture, a rigid cylindrical outer partition extending rearwardly from said divider part way to the rear of said casing to define a chamber rearwardly of said speaker and an annular passage between said outer partition and said peripheral wall of said casing, said chamber having a rear wall with a central aperture, and a rigid cylindrical inner partition in said central aperture of said rear wall of said chamber and extending forwardly and rearwardly of said rear wall.

2. A unidirectional speaker enclosure as claimed in claim 1, wherein said primary aperture has a generally circular shape and said secondary aperture has a generally circular annular shape concentric with said primary aperture.

3. A unidirectional speaker enclosure as claimed in claim 1, wherein said rear wall of said chamber is located substantially in the median portion of said casing.

4. A unidirectional speaker enclosure as claimed in claim 3, wherein said inner partition comprises a cylindrical lateral wall in which two end apertures, namely a front aperture and a rear aperture, are formed on either side respectively of said rear wall of said chamber, said rear aperture being spaced forwardly from the closed rear end of said casing and said front aperture being spaced rearwardly from said primary aperture.

5. A unidirectional speaker enclosure as claimed in claim 4, wherein said outer and inner partitions provide a first relatively large first resonance chamber of cylindrical configuration with an annular cross-section, said first resonance chamber being adjacent the rear face of the speaker membrane, a second relatively large resonance chamber in a rearward portion of said casing, a tuning tunnel connecting said first resonance chamber with said second resonance chamber, and an annular decompression vent passage extending from said second resonance chamber to said secondary aperture.

6. A unidirectional speaker enclosure as claimed in claim 5, wherein the respective dimensions and the relative positions of said cabinet, outer partition and inner partition are such that they impart to said relatively large resonance chambers, tuning tunnel and vent passage predetermined acoustical impedances corresponding to the specific desired characteristics of the enclosure.

7. A unidirectional speaker enclosure as claimed in claim 6, wherein said relatively large resonance chambers, tuning tunnel and vent passage effect a lag of the order of one wavelength of a predetermined critical frequency between the backward wave and the forward wave produced by said speaker membrane.

8. A unidirectional speaker enclosure as claimed in claim 7, which is free of any internal padding.

* * * * *